United States Patent
Berg et al.

(10) Patent No.: US 8,537,973 B2
(45) Date of Patent: Sep. 17, 2013

(54) ESTIMATING PAIR SYMMETRY STATUS FOR A COMMUNICATION LINE

(75) Inventors: Miguel Berg, Upplands Väsby (SE); Daniel Cederholm, Sollentuna (SE)

(73) Assignee: Telefonaktiebolaget LM Ericsson (publ), Stockholm (CH)

( * ) Notice: Subject to any disclaimer, the term of this patent is extended or adjusted under 35 U.S.C. 154(b) by 0 days.

(21) Appl. No.: 13/635,838

(22) PCT Filed: Mar. 26, 2010

(86) PCT No.: PCT/SE2010/050339
§ 371 (c)(1),
(2), (4) Date: Sep. 18, 2012

(87) PCT Pub. No.: WO2011/119081
PCT Pub. Date: Sep. 29, 2011

(65) Prior Publication Data
US 2013/0010931 A1    Jan. 10, 2013

(51) Int. Cl.
*H04M 1/24* (2006.01)
*H04M 3/08* (2006.01)
*H04M 3/22* (2006.01)
*G01R 31/08* (2006.01)

(52) U.S. Cl.
USPC ............. 379/22.08; 379/1.04; 370/252

(58) Field of Classification Search
USPC ........ 379/1.03, 1.04, 22.08, 23, 24; 370/241, 370/252
See application file for complete search history.

(56) References Cited

U.S. PATENT DOCUMENTS

| 2009/0116639 | A1* | 5/2009 | Zimmerman et al. | 379/417 |
| 2010/0027601 | A1* | 2/2010 | Fang | 375/222 |
| 2012/0219123 | A1* | 8/2012 | Berg et al. | 379/27.01 |

OTHER PUBLICATIONS

Kerpez, K.J., et al., "Integrated DSL Test, Analysis, and Operations." IEEE Transactions on Instrumentation and Measurement, vol. 57, No. 4, pp. 770-780. Apr. 2008. IEEE, Piscataway, NJ.

See, K.Y., et al. "Longitudinal conversion loss of power line network for typical Singapore household." Power Engineering Conference, 2005. The 7th International, Singapore, Nov. 29-Dec. 2, 2005. Conference Proceedings, IPEC 2005. pp. 1-6. IEEE, Piscataway, NJ.

Lee, B., et al., "Binder MIMO Channels." IEEE Transactions on Communications, vol. 55, No. 8, pp. 1617-1628. Aug. 2007. IEEE, Piscataway, NJ.

* cited by examiner

*Primary Examiner* — Quoc D Tran
(74) *Attorney, Agent, or Firm* — Coats & Bennett, P.L.L.C.

(57) ABSTRACT

An apparatus for estimating pair symmetry status for a communication line ($C_i$). The apparatus is configured to: obtain a value set indicative of a signal to noise ratio for the communication line ($C_i$) and at a receive band frequency (f); determine a crosstalk coupling length ($L_i$) for the communication line ($C_i$); and estimate the pair symmetry status, based on the obtained value set indicative of the signal to noise ratio ($SNR_i$ (f)), the crosstalk coupling length ($L_i$) and a predetermined symmetry indicator-value ($q_{max}$; $k_{i,max}$). Related method and computer readable medium are also described.

21 Claims, 8 Drawing Sheets

$$\hat{q}_i = \left(\frac{\hat{k}_i}{2{,}62 \cdot 10^{-19}}\right)^{\frac{1}{0.6}}$$

$$\widehat{SNR}_i(f) = \frac{1}{\hat{k}_{i,\max} \cdot L_i \cdot f^2}$$

$$\hat{k}_i = \frac{1}{SNR_i(f) \cdot L_i \cdot f^2}$$

ESTIMATING PAIR SYMMETRY STATUS FOR A COMMUNICATION LINE

TECHNICAL FIELD

The invention relates to estimation of pair symmetry status in a telecommunication line using digital subscriber line technology.

BACKGROUND

There are many different types of noise that affect digital subscriber line (DSL) technology, such as impulse noise, radio frequency interference (RFI) and crosstalk. Also, stationary noise typically causes reduced data transfer rates due to lowered signal to noise ratio (SNR) while non-stationary noise in form of e.g. impulse noise, fading RFI and fluctuating crosstalk typically cause stability problems for DSL.

While impulse noise and RFI are only present in certain environments, crosstalk is always present when there are other active communication lines (disturbers) in a telecommunication cable (cable) or cable binder (binder). As is known within the art, a binder is a subgroup of the cable. The cable consists of two or more communication lines arranged adjacent to each other, where one communication line (also referred to as "line" or "pair") typically comprises a pair of twisted wires (pair). Cables with many pairs are usually subdivided into binders where pairs within a binder typically experience stronger crosstalk between each other compared with pairs in different binders.

A typical noise environment seen by a DSL transceiver is thus dominated by crosstalk. Crosstalk depends on many factors such as the quality of the communication line, the number of disturbers and their transmit power spectral density (PSD). The crosstalk typically comprises far end crosstalk (FEXT) and near end crosstalk (NEXT), where FEXT in a line is interference, from one or more adjacent lines, as measured at the end of the line farthest from the adjacent lines' transmitters, while NEXT is interference from one or more adjacent lines, as measured at the end of the line nearest to the adjacent lines' transmitters.

Noise in general and crosstalk in particular is a major cause of capacity limitation for DSL technology. Since DSL is based on differential mode transmission, the level of external noise coupled into the communication line is dependent on the so called "pair symmetry", which is a measure of the similarity in coupling of the external noise into each wire in a pair (communication line). If the coupling is identical, both wires will contain identical noise signals and thus the noise will be completely cancelled by the differentially coupled receiver connected to the line. Such perfect pair symmetry will not be the case in conventional communication lines.

Hence, knowing the pair symmetry is relevant because it affects the noise in the communication line. Also, pair symmetry can be used as an indicator for a group of faults that affect the performance of the line, and may indicate whether the line needs to be repaired. A prior art method for detecting problems with pair symmetry includes comparing a measured noise PSD with a constant threshold value, e.g. by investigating if the average noise level in a certain frequency band is above a certain threshold.

If pair symmetry in a communication line is poor the so called line balance is frequently also poor. Line balance is often referred to as longitudinal conversion loss (LCL) of a twisted pair (i.e. twisted wire) communication line (P. Golden et al, "Fundamentals of DSL Technology", Auerbach Publications, USA, 2006).

Prior art in the area of detecting problems with line balance and high noise levels are commonly based on LCL measurement with dedicated metallic line testing (MELT) instruments, or based on using test functionality integrated in POTS (plain old telephone service) linecards. An example of a measurement setup to determine line balance is described in ITU-T (International Telecommunication Union) Recommendation G.996.1, "Test procedures for digital subscriber line (DSL) transceivers", February 2001.

A problem with prior art in the area of identifying pair symmetry by comparing a measured noise PSD with a constant threshold is that it is rather inaccurate. One line may exhibit a particular noise level due to a fault whereas the same noise level may be found in another line that is functioning normally.

Determining line balance according to prior art techniques has also some disadvantages, e.g. because necessary measurements require galvanic access to the individual wires in the communication line as well as to a ground reference. Traditionally, this has been accomplished by using either dedicated instruments or test functionality built into the POTS linecards. For remote deployment of DSLAMs (e.g. in cabinets) it is relative expensive to manually connect test instruments in order to check if there is a fault on the line. Also, manual testing is labour intensive and takes significant time to complete, which prevents first line support when e.g. talking to a customer. Further, since Voice over IP is increasingly replacing traditional POTS for telephony, testing functionality in POTS linecards will not always be available.

SUMMARY

It is an object of the invention to at least partly overcome one or more of the above-identified limitations of the prior art. In particular, it is an object to provide an apparatus that may estimate pair symmetry status for a communication line, which may also bee seen as detection of line balance for the communication line.

Hence an apparatus is provided for estimating pair symmetry status for a communication line. The apparatus is configured to: obtain a value set indicative of a signal to noise ratio (SNR) for the communication line and at a receive band frequency; determine a crosstalk coupling length for the communication line; and estimate the pair symmetry status, based on the obtained value set indicative of the signal to noise ratio, the crosstalk coupling length and a predetermined symmetry indicator-value.

The communication line (also referred to as "line" or "pair") generally comprises multiple wires arranged adjacent each other, such as a so called twisted pair wire, where the wires can be subjected to mutual crosstalk.

The pair symmetry status is a measure that indicates the pair symmetry of the communication line, and may be e.g. a grade {"bad", "moderate", "good", "excellent"} or any type of numerical indicator that represents the pair symmetry. In brief, the qualitative measure "pair symmetry status" has been defined since it is not always necessary to know the exact properties of the pair symmetry, even though the degree of the pair symmetry may vary.

The apparatus utilizes, for example, that the communication line can experience good pair symmetry with respect to ground (balance) but bad pair symmetry with respect to another pair e.g. if the twisting rate of the two pairs are too similar. This is not necessarily a fault but can still affect performance of the communication line. However, several faults that affect balance will also affect pair symmetry with respect to other pairs. Thus, it has been realized that the pair symmetry status can be used to indicate the level of line balance and/or crosstalk coupling. For example, an indication of a poor symmetry status can bee seen as a poor line balance. The conclusion that pair symmetry status can be used for estimating line balance comes in part from the insight that pair symmetry can be measured either with respect to ground or to other pairs, and that pair symmetry with respect to other pairs is related to the crosstalk coupling while pair symmetry with respect to ground is related to line balance.

The value set indicative of the SNR can be any measure that quantifies how much a signal has been or is expected to be corrupted by noise, and can e.g. be defined as e.g.: the ratio of signal power to noise power at the receiver (e.g. as measured by DELT or DSL initialization); the signal power and noise power at the receiver (e.g. as measured by SELT, DELT or DSL initialization); a transmitted signal Power Spectral Density (PSD), (power) transfer function (or attenuation), and received noise power; bitloading (modulation order) and SNR margin as defined in e.g. ITU-T G.993.2, G.992.3, G.992.5 standards and obtained during showtime operational state; and bitloading, SNR margin, and gain scaling as defined in above mentioned standards and obtained during showtime operational state.

From above follows that the value set indicative of the SNR can include only one value, or can include multiple values which in combination may indicate the SNR. Also, the value set can be same for each frequency used for communication in the line, or can be different for different frequencies. Thus, the SNR can be obtained in a number of different ways that use various types of measurements formulas and standards, and includes any measure or estimation indicative of how much a signal has been or is expected to be corrupted by noise.

The crosstalk coupling length typically represents the length of cable where the disturbing and disturbed communication lines are adjacent. In case of multiple disturbing lines, the crosstalk coupling length is typically an average of the coupling lengths from all disturbing lines to the disturbed line. An upper bound to the coupling length is the length of the communication line. In case of only two pairs, the coupling length cannot be longer than the shorter of the two pairs but in general, it is difficult to find the true coupling length and therefore the crosstalk coupling length may be estimated, i.e. set, to the length of the communication line, which often is referred to as the loop length.

One of the ideas of the apparatus is to detect problems related to line balance on a communication line by comparing measurements of e.g. SNR (or another measurement representative of a noise, such as those given above) with values predicted by a crosstalk model describing crosstalk coupling levels that are rarely exceeded. Then, in an exemplifying embodiment, a 1% worst-case model may be used. If the result shows stronger noise (lower SNR) than the model, it is likely due to a fault that affects either the line balance or the crosstalk coupling or both. The apparatus may utilize the fact that many common faults that degrade pair-to-pair symmetry will also degrade line balance and thus increase crosstalk coupling. Examples of such faults include when one of the wires in a pair is broken (cut) or when a pair is split (differential transmission on one wire from one pair together with one wire from another pair).

The principles of the apparatus are not restricted to DSL but could be used in other communication systems where communication is performed over multiple communication lines close to each other.

Typically, the apparatus can be a hardware component arranged in a central office (CO) of a DSL communication system, but can also be a digital subscriber line access multiplexer (DSLAM) that might be arranged in a CO. The apparatus may also be a customer premises equipment (CPE) such as a DSL modem that communicates with an apparatus in a CO. Also, the apparatus may be a DSL operations and management apparatus (system) that obtains the value set indicative of a SNR by receiving it from a DSL modem or a DSLAM. Typically the apparatus is configured to implement known protocols and standards within the field of DSL technology, and can e.g. include the same physical components as known DSLAM-units, DSL modems and/or DSL operations and management systems.

In case the apparatus is a DSLAM or DSL modem, the communication line is typically connected to the apparatus. The communication line is generally also connected to a DSLAM or DSL modem when the apparatus is a DSL operations and management system, which then allows the DSLAM or DSL modem to measure the SNR and to either estimate the pair symmetry status or send a measured value set indicative of a signal to noise ratio (SNR) to the DSL operations and management system, which then estimates the pair symmetry status.

Both upstream and downstream pair symmetry status may be estimated, which may be different because the downstream receiver is located at the customer premises (CP) and the upstream receiver is located at the central office (CO) or other location. An asymmetry close to the CO will for example affect upstream while it might not be seen at all in the downstream if the communication line is long enough. Upstream pair symmetry status is thus the symmetry seen from the CO side while downstream pair symmetry status is the symmetry seen from the CP side. The difference between estimating downstream or upstream pair symmetry status thus lies in using data measured by the CP receiver or data measured by the CO receiver.

Typically, a processor unit within the apparatus (in form of e.g. a DSL modem, a DSLAM or a DSL operations and management system) is configured to perform the obtaining, determining and estimating as well as to implement other features described below.

The apparatus is advantageous in that it can be used to estimate pair symmetry status or line balance by using existing hardware in DSL transceivers, which is a significant improvement compared to prior art which usually require either dedicated test instruments or line cards with galvanic access to twisted pair wires.

The apparatus may be configured to estimate the pair symmetry status by: determining a coupling coefficient based on the value set indicative of obtained signal to noise ratio and based on the crosstalk coupling length; and comparing a value indicative of the determined coupling coefficient with the predetermined quality indicator-value.

The apparatus may be configured to determine the coupling coefficient based on $$\hat{k}_i = \frac{1}{SNR_i(f) \cdot L_i \cdot f^2}.$$

where $L_i$, is the crosstalk coupling length.

The apparatus may be configured to: determine a binder fill ratio as a function of the coupling coefficient, and estimate the pair symmetry status by comparing the binder fill ratio with the predetermined symmetry indicator-value.

The apparatus may be configured to estimate the pair symmetry status by: calculating a value set indicative of a signal to noise ratio, based on the crosstalk coupling length and the predetermined symmetry indicator-value; and comparing the obtained value set indicative of the signal to noise ratio with the calculated value set indicative of the signal to noise ratio.

The apparatus may be configured to calculate the signal to noise ratio based on $$\hat{S}NR_i(f) = \frac{1}{\hat{k}_{i,max} \cdot L_i \cdot f^2}.$$

The obtained value set indicative of the signal to noise ratio may be retrieved by execution of a single or double-ended line test for the communication line.

At least a part of the obtained value set indicative of the signal to noise ratio may be retrieved by execution of a quiet line noise measurement in the communication line.

The apparatus may be configured to estimate the pair symmetry status by taking into account a background noise in the communication line.

The apparatus may be configured for being able to estimate the pair symmetry stats when an end of the communication line is not connected to any customer premises equipment (CPE) for estimating the pair symmetry status. However, this does not prevent that the communication line is physically connected to a CPE, but the CPE is then not actively used for estimating the pair symmetry status. Of course, if a double-ended line test is performed, then a CPE connected to the communication line is actively used for estimating pair symmetry status.

According to another aspect, a method is provided for estimating pair symmetry status for a communication line, the method comprising the steps of: obtaining a value set indicative of a signal to noise ratio for the communication line and at a receive band frequency; determining a crosstalk coupling length for the communication line; and estimating the pair symmetry status, based on the obtained value set indicative of the signal to noise ratio, the crosstalk coupling length and a predetermined symmetry indicator-value.

The inventive method is typically performed by an apparatus like a DSLAM or a CPE such as a DSL modem, or by a DSL operations and management system that receives measurement data such as the signal to noise ratio from a DSL modem or DSLAM. The method may include any of the functionality implemented by the features described above in association with the inventive apparatus and shares the corresponding advantages.

For example, the pair symmetry status may be estimated by: determining a coupling coefficient based on the value set indicative of the obtained signal to noise ratio and based on the crosstalk coupling length; and comparing a value indicative of the determined coupling coefficient with the predetermined quality indicator-value.

The coupling coefficient may be determined based on $$\hat{k}_i = \frac{1}{SNR_i(f) \cdot L_i \cdot f^2}.$$

The method may comprise the steps of: determining a binder fill ratio as a function of the coupling coefficient; and estimating the pair symmetry status by comparing the binder fill ratio with the predetermined symmetry indicator-value.

The pair symmetry status may be estimated by: calculating a value set indicative of a signal to noise ratio, based on the crosstalk coupling length and the predetermined symmetry indicator-value; and comparing the obtained value set indicative of the signal to noise ratio with the calculated value set indicative of the signal to noise ratio.

The signal to noise ratio may be calculated based on $$\hat{S}NR_i(f) = \frac{1}{\hat{k}_{i,max} \cdot L_i \cdot f^2}.$$

The obtained value set indicative of the signal to noise ratio may be retrieved by execution of a single or double-ended line test for the communication line.

At least a part of the obtained value set indicative of the signal to noise ratio may be retrieved by execution of a quiet line noise measurement in the communication line.

The method may comprise estimating the pair symmetry status by taking into account a background noise in the communication line.

When using the method, an end of the communication line must not necessarily be connected to any customer premises equipment (CPE) for estimating the pair symmetry status. However, this does not prevent that the communication line is physically connected to a CPE, but the CPE is then not actively used for estimating the pair symmetry status.

According to another aspect a computer-readable medium is provided, which stores processing instructions that, when executed by a processor unit, performs the method above and any embodiments thereof.

BRIEF DESCRIPTION OF THE DRAWINGS

Embodiments of the invention will now be described, by way of example, with reference to the accompanying schematic drawings, in which.

DETAILED DESCRIPTION

Figure 1A:
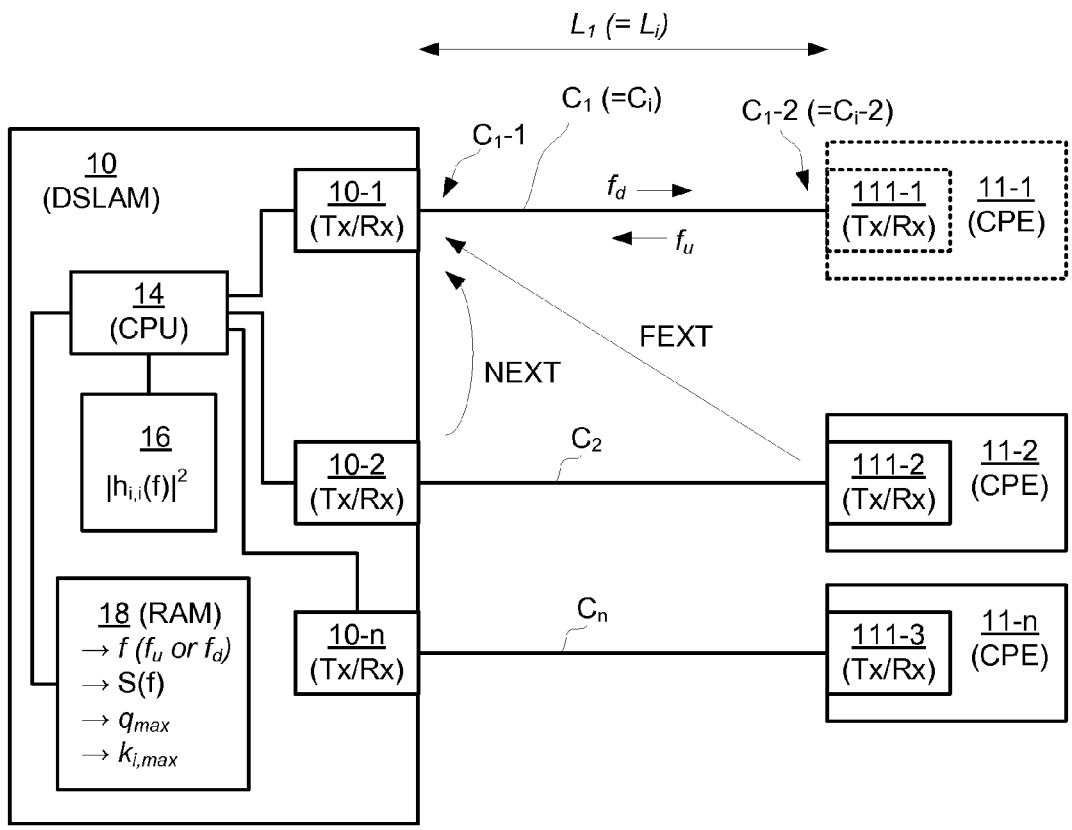
FIG. 1a is a view of a DSL communication system which includes apparatuses in form of a DSLAM and CPE's which each can estimate pair symmetry status for a respective communication line.

With reference to FIG. 1a an apparatus 10 for estimating line balance is illustrated. The apparatus 10 is, for example, a DSLAM which includes or cooperates with n number of transceivers (Tx/Rx) 10-1, 10-2, 10-n. Each of the transceivers 10-1, 10-2, 10-n is connected with a central processing unit (CPU) 14 and is capable of transmitting a signal via a respective communication line $C_1$, $C_2$, $C_n$ at a downstream frequency $f_d$. Each transceiver 10-1, 10-2, 10-n can also receive a signal via the respective communication line $C_1$, $C_2$, $C_n$ at an upstream frequency $f_u$.

The apparatus 10 also includes a memory unit (RAM) 18, i.e. a computer-readable medium, that is connected to the processor unit 14 and is used for storing processing instructions that, when executed by the processor unit 14, performs the method described below. The memory unit 18 also includes data about upstream frequencies that may be used for upstream transmission via the communication lines $C_1$, $C_2$, $C_n$ as well as data about which downstream frequencies that may be used for downstream transmission via the communication lines $C_1$, $C_2$, $C_n$.

Moreover, the memory unit 18 also holds information about values for downstream power spectral density $\overline{S}_{DS}(f_d)$ and upstream power spectral density $\overline{S}_{US}(f_u)$ that may be used for transmission via the communication lines $C_1$, $C_2$, $C_n$, and may hold predetermined symmetry indicator-values such as the below discussed coupling constant $\hat{k}_{i,max}$ or binder fill ratio $q_{max}$.

The apparatus 10 has also a power transfer function module 16 for determining a downstream power transfer function $|h_{i,i}(f_d)|^2$ and an upstream power transfer function $|g_{i,i}(f_u)|^2$.

n number of CPEs 11-1, 11-2, 11-n are via communication lines $C_1$, $C_2$, $C_n$ connected to a respective transceiver 10-1, 10-2, 10-n in the apparatus 10. Each of the CPEs can also be implemented as an apparatus for estimating pair symmetry status. When a CPE estimates pair symmetry status, the CPE operates in a manner similar with the DSLAMs estimation of pair symmetry status. More specifically, each of the CPEs 11-1, 11-2, 11-n has a respective transceiver 111-1, 111-2, 111-n for establishing the connection with the apparatus 10, such that upstream and downstream data transmission (signal exchange) may be realized between the apparatus 10 and the CPEs 11-1, 11-2, 11-n. Each of the CPEs also includes a processor unit that may execute the below described method.

The first CPE 11-1 is illustrated with dashed lines since it is not always needed when the DSLAM 10 performs the method described below, i.e. in one of the examples below, the apparatus 10 performs noise measurements on the first communication line $C_1$ which must not necessarily be connected to a CPE.

The end $C_1$-2 is a so called far-end of the communication line $C_1$ as seen from the apparatus 10, while the other end $C_1$-1 is the near-end of the communication line $C_1$. Hence, as seen from the apparatus 10, far-end crosstalk can be seen as induced by transmission at the far-end $C_1$-2 while near-end crosstalk can be seen as induced by transmission at the near-end $C_1$-1.

The CPEs 11-1, 11-2, 11-n are typically DSL modems which together with the apparatus 10 in the form of a DSLAM are implemented in accordance with a known DSL-standard. This includes e.g. all types of ADSL and VDSL standards, such as the Telecommunication Standardization Sector (ITU-T) G.992.1, G.992.3, G.992.5, G.993.1, G.993.2-standards as well as similar future standards. For example, the apparatus 10 can be configured to use built in DSLAM tests such as single ended line testing (SELT), double ended line testing (DELT) (also known as Loop Diagnostics in ITU-T G.992.3, G.993.2), and showtime or initialization test and status parameters for estimation of pair symmetry.

Each of the transceivers 10-1, 10-2, 10-n of the apparatus 10 are implemented such that they can communicate with the transceiver at the other end of the communication line $C_1$, $C_2$, $C_n$ and measure the SNR over each corresponding line, for example in accordance with loop diagnostics (DELT) in the standards ITU-T G.992.3 and G.993.2.

The processor unit 14 can comprise one or more data processors which each performs one or more of the operations of the apparatus 10, and any of the transceivers 10-1, 10-2, 10-n, 111-1, 111-2, 111-n in the apparatus and in the CPEs can comprise a respective transmitter and receiver. Each of the communication lines $C_1$, $C_2$, $C_n$ typically comprises similar structures, e.g. in the form of unshielded, twisted pair of copper wires.

Figure 1B:
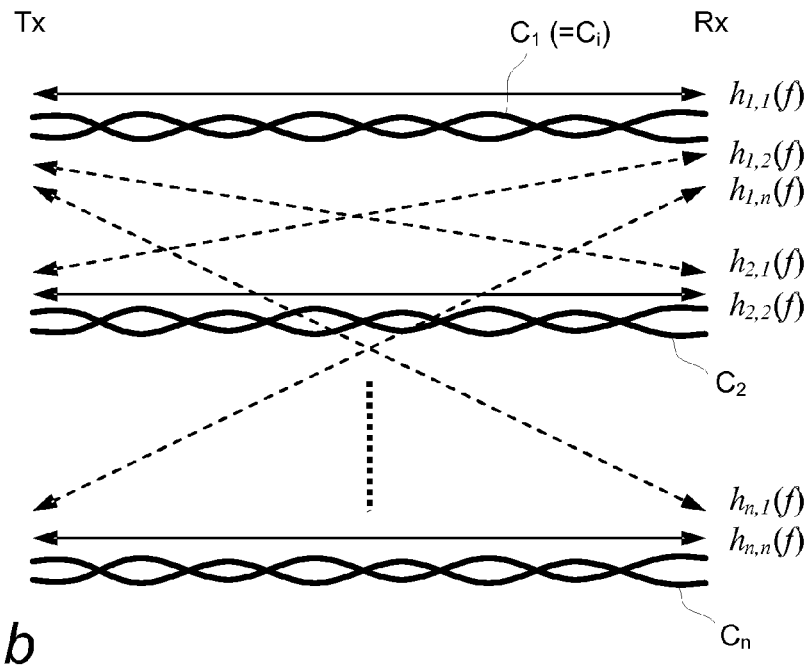
FIG. 1b illustrates direct channels and far-end crosstalk couplings between communication lines of FIG. 1a, FIGS. 2a-c.illustrate expressions used in various calculations for estimating pair symmetry status for a communication line.

With further reference to FIG. 1b, direct channels (communication lines) and FEXT couplings between the communication lines $C_1$, $C_2$, $C_n$ of the apparatus 10 are illustrated, where h denotes downstream couplings, Tx denotes a transmitter and Rx denotes a receiver. For DSL downstream (DSLAM to CPE), the DSLAM is the transmitter and the CPE is the receiver while for DSL upstream (CPE to DSLAM), the CPE is the transmitter and the DSLAM is the receiver.

The apparatus in form of a DSLAM 10 or a CPE 11-1 utilizes measured (or otherwise given) noise power spectral density (PSD) or some other parameter that depends on the noise PSD, e.g. Signal-to-Noise Ratio (SNR) or a combination of parameters such as bit loading and SNR margin in a DSL system (e.g. ITU-T G.992.3, G.992.5, G.993.2). This input data is then combined with a noise model such as the 1% worst-case crosstalk model in ITU-T G.996.1. If certain actual data exceeds predicted values by a certain margin, a fault is indicated. Since crosstalk could in rare occasions exceed the worst-case model (here 1%), the margin can be adapted according to a trade-off between the number of false detections and the number of undetected faults.

Example calculations are shown for FEXT but similar calculations could be performed for NEXT as well by using worst-case NEXT models instead of worst-case FEXT models and measuring noise on frequencies where NEXT is dominating.

Noise PSD measurements in DSL can be performed according to ITU-T G.996.2, also known as G.linetest. Currently, Single-Ended Line Test (SELT) is specified but future versions of the standard are expected to also include Double-Ended Line Test (DELT) measurements where both the DSLAM and the CPE measure the so called Quiet Line Noise (QLN), which is the received signal (noise) when any transmitters connected to the communication line are silent. SELT measures noise at the near end while DELT measures noise at both the near end and the far end. The following sections describe how to compare the measured or estimated SNR or noise, to a worst case crosstalk scenario in order to detect balance-related problems in the communication line.

It should be noted that if the SNR is measured directly, expression (20) below can be utilized to directly calculate the coupling constant.

Further, the apparatus can be configured to estimate the SNR from other DSL parameters like e.g. bitloading per subcarrier (BITSps) and SNR margin. The bitloading shows how many bits that are transported per symbol for each subcarrier (frequency bin) and it can be calculated as:

$$BITSps = \log_2\left(1 + \frac{SNR}{SNRmargin \cdot SNRgap}\right) \quad (1)$$

where SNRgap is an offset from the Shannon capacity including coding gains, implementation losses etc. Since DSL systems typically operate at high SNR values (SNR>>1), the formula can be simplified to:

$$BITSps = \log_2\left(\frac{SNR}{SNRmargin \cdot SNRgap}\right) = \quad (2)$$
$$\frac{(SNR_{dB} - SNRmargin_{dB} - SNRgap_{dB})}{10 \cdot \log_2(2)} =$$
$$\frac{(SNR_{dB} - SNRmargin_{dB} - SNRgap_{dB})}{3}$$

This shows that every 3 dB increase of SNR allows one additional bit in the bitloading and thus SNR can be calculated as:

$$SNR = 10^{\frac{3 \cdot BITSps + SNRmargin_{dB} + SNRgap_{dB}}{10}} \quad (3)$$

The SNRmargin is known by the receiver and can be retrieved e.g. by a DSL management system while the SNRgap typically is a rather constant value that only changes a few dB depending on operating conditions (channel coding etc.) and can thus be approximated.

Yet another parameter that can be used for estimating pair symmetry status is the so called quiet line noise (QLN). Each transceiver 10-1, 10-2, 10-n of the apparatus 10 may therefore be implemented such that they can measure the QLN over each of the communication lines $C_1$, $C_2$, $C_n$, for example in accordance with the standard ITU-T G.996.2, which describes how the QLN may be measured and reported.

QLN is the total received noise as measured by a DSL transceiver when the transmitters at both ends of the particular line are silent. QLN is commonly given in dBm/Hz unit, i.e. dB relative to 1 mW per Hz and the QLN per frequency bin in down- and upstream is denoted $QLN_{DS}(f)$ and $QLN_{US}(f)$ respectively. It typically consists of FEXT, NEXT, and background noise. Background noise includes both thermal noise in the receiver and other noise sources (from electrical and electronic equipment). In the following, the presented expressions are equally applicable to upstream (US) and downstream (DS) by inserting proper values. From this follows that, as mentioned, the method may be implemented both in e.g. a DSLAM or in a CPE. The total received noise PSD for line i (illustrated by line $C_1$ in FIGS. 1 and 2) is:

$$R_{Noise,i}(f)[W/Hz] = R_{FEXT,i}(f) + R_{NEXT,i}(f) + N_i(f) \quad (4)$$

where the three terms on the right hand side correspond to received FEXT, NEXT, and background noise powers respectively. Thus, QLN (in dBm/Hz) per frequency bin f for line i can be written as:

$$QLN_i(f)[dBm/Hz] = 10 \cdot \log_{10}\left(\frac{R_{Noise,i}(F)}{10^{-3}}\right) \quad (5)$$

The received crosstalk signal in pair i from a signal transmitted in pair j can be expressed as the transmitted signal PSD multiplied by the crosstalk power transfer function (P. Golden et al, "Fundamentals of DSL Technology", Auerbach Publications, U.S.A, 2006). For downstream, this becomes:

$$R_{i,j}(f) = S_j(f) \cdot |h_{i,j}(f)|^2 \quad (6)$$

where $R_{i,j}(f)$ is the received PSD, $S_j(f)$ is the transmit PSD in pair j and $h_{i,j}(f)$ is the crosstalk power transfer function between pairs j and i. Thus, the total FEXT PSD in line i can be calculated by adding the individual FEXT contributions from all other lines:

$$R_{FEXT,i}(f) = \sum_{j \neq i} R_{FEXT,i,j}(f) = \sum_{j \neq i} S_j(f) \cdot |h_{i,j}(f)|^2 \quad (7)$$

where $S_j(f)$ denotes the transmit PSD on line j in the direction of interest (up/down). The received NEXT PSDs could be written in a similar manner but are not shown here.

As seen from expression (4), QLN generally consists of FEXT, NEXT, and background noise. NEXT is usually much stronger than FEXT since it has traveled a much shorter distance in the line and is thus less attenuated, which makes it difficult to estimate FEXT in the presence of NEXT. However, since most DSL flavors use disjoint transmit and receive bands (also known as frequency division duplexing, FDD), receive band noise will typically be dominated by FEXT while transmit band noise will be dominated by NEXT. Thus, it is assumed that QLN(f) as measured in a receive band contains negligible amounts of NEXT. Measuring QLN in such bands will then typically yield the sum of FEXT and background noise.

Further, FEXT is commonly significantly stronger than the background noise, meaning that a QLN measurement in a receive band will give a good estimate of the total FEXT level as given in expression (7). Exceptions to this may occur, e.g. for very short lines and very long lines where background noise may dominate.

For frequency bands where NEXT can be neglected, the aggregated (total) FEXT coupling from all other lines to line i, weighted by the transmit PSDs, can be estimated by dividing the total received noise power from expression (4) by the average transmit PSD and utilizing expression (7):

$$\frac{R_{Noise,i}(f)}{\overline{S}(f)} = \frac{\sum_{j \neq i} S_j(f) \cdot |h_{i,j}(f)|^2 + R_{NEXT,i}(f) + N_i(f)}{\frac{1}{n}\sum_{j \neq i} S_j(f)} \quad (8)$$

The above expression can be rewritten as:

$$\frac{R_{Noise,i}(f)}{\overline{S}(f)} = \frac{\sum_{j \neq i} S_j(f) \cdot |h_{i,j}(f)|^2}{\frac{1}{n}\sum_{j \neq i} S_j(f)} + \varepsilon(f) = |H_i(f)|^2 + \varepsilon(f) \quad (9)$$

Where, $\overline{S}(f)$ is the average transmit PSD, $|H_i(f)|^2$ is the aggregated FEXT power transfer function, while $\epsilon(f)$ is the estimation error caused by non-FEXT noise, and finally n is the number of active crosstalkers. If FEXT is the dominating noise in the measured frequency bands, the estimation error will be small and can often be neglected. It should be noted that individual transmit PSDs do not need to be known, only their average. A first approximation could be to use the maximum allowed PSD since it is common to operate DSL lines close to their maximum allowed limits. An alternative is to read out certain parameters (e.g. according to ITU-T G.997.1) from the management system in order to determine the transmit PSDs for all lines and then determine the average transmit PSD from the individual transmit PSDs.

As a special case, if the background noise is negligible and all lines use the same transmit PSDs (e.g. max allowed PSD), the aggregated FEXT coupling in expression (9) will reduce to:

$$|H_i(f)|^2 = \sum_{j \neq i} |h_{i,j}(f)|^2 \tag{10}$$

The crosstalk power transfer functions usually vary between different pairs in a cable binder since the cables are not perfectly homogenous and symmetrical. It is inevitable that for a multi-pair cable binder, some pairs will be closer located to each other than other pairs, thus leading to relatively higher crosstalk. It is therefore difficult to define a model that describes the behavior of each single crosstalk power transfer function in an accurate way. The most commonly used crosstalk models therefore describe the 1% worst case scenarios meaning that 99% of all lines should experience less crosstalk than what is predicted by the model. Such a model is e.g. defined by the standardization sector of the International Telecommunication Union (ITU-T) with the purpose of providing a standardized set of testing procedures for DSL transceivers. The proposed model for the FEXT crosstalk power transfer function is described in ITU-T Recommendation G.996.1, "Test procedures for digital subscriber line (DSL) transceivers", February 2001. Using that model with notation adapted to the convention in this document yields:

$$|H_i(f)|^2 = |h_{i,j}(f)|^2 \cdot k_i \cdot L_i \cdot f^2 \tag{11}$$

where $|h_{i,j}(f)|^2$ is the power transfer functions for communication line i, $k_i$ is a coupling constant, $L_i$ is the crosstalk coupling length in meter (m), and f is frequency (Hz).

The crosstalk coupling length $L_i$ is estimated to the loop length (true length) of the communication line. It should then be noted that the true crosstalk coupling length experienced by line i can be shorter but not longer than the loop length. However, for most communication lines used today the difference between true and estimated crosstalk coupling length is insignificant The coupling constant $k_i$ from the above expression has been determined by empirical studies (see ITU-T Recommendation G.996.1) to be $k = 2{,}62 \cdot 10^{-19} (n/49)^{0.6}$ for the 1% worst FEXT case (99$^{th}$ percentile) in a 50-pair binder where n is the number of disturbers. If the crosstalk coupling length $L_i$ was given in feet, the coupling constant k would be $k = 8 \cdot 10^{-20} (n/49)^{0.6}$. In this case the right part of expression (11) should be multiplied with a meter-to-feet conversion constant of $1/0.3048 \approx 3.28$ ft/m.

In order to use the model for other binder sizes, it is convenient to replace n/49 with the binder fill ratio, q, defined as $$q = \frac{n}{N-1}$$

where N is the number of pairs in the binder. In this case, q could be any (rational) number between 0 and 1 representing the fraction of active crosstalk disturbers in the binder. However, it should be noted that since the original model was developed from measurements on a 50-pair binder, it is not necessarily valid for other binder sizes. For small binder sizes, the number of neighbor pairs surrounding each pair may be too small for accurate results, especially for low binder fill ratios. Still, it is expected that the model will work sufficiently well for common binder sizes where the proposed apparatus and method would be utilized. Below a measurement results where the binder fill ratio is estimated for a 10-pair binder discussed.

In a typical DSL environment the noise will be dominated by crosstalk and, as mentioned earlier, since most DSL types utilize FDD, the noise measured at the near end of the communication line will commonly be dominated by FEXT from the far end. Assuming that all disturbers are using the same DSL flavor (with compatible band plans) it is possible to estimate the FEXT power transfer function of the system by rewriting expression (9) above into:

$$|H_i(f)|^2 = \frac{R_{Noise,i}(f)}{\overline{S}(f)} - \varepsilon(f) \tag{12}$$

The SELT echo measurement can provide estimations of both the loop length, and thus the crosstalk coupling length, and the transfer function of the line and hence the only unknown in equation (11) is the coupling constant $k_i$. Rewriting the equation gives an expression for the estimated FEXT coupling constant from the FEXT coupling:

$$\hat{k}_i = \frac{|H_i(f)|^2}{|h_{i,i}(f)|^2 \cdot L_i \cdot f^2} \tag{13}$$

Together with expression (12), the estimated coupling constant for line i is then given as a function of the measured noise PSD and other, presumably known, parameters:

$$\hat{k}_i = \frac{\frac{R_{Noise,i}(f)}{\overline{S}(f)} - \varepsilon(f)}{|h_{i,i}(f)|^2 \cdot L_i \cdot f^2} \tag{14}$$

Now, if the error term $\epsilon(f)$ is negligible or known a priori, the coupling coefficient can be calculated directly from (14) by e.g. setting $\epsilon(f)$ to zero. If noise is only measured on a single frequency, calculation of $\hat{k}_i$ is straightforward. If noise is measured on multiple frequencies, $\hat{k}_i$ can be calculated e.g. by averaging the right hand of (14), either in linear or logarithmic (dB) scale. Averaging (14) in linear power scale and assuming that the error term is zero thus yields:

$$\hat{k}_i = \frac{1}{\|\Theta\|} \sum_{f \in \Theta} \frac{R_{Noise,i}(f)}{\overline{S}(f) \cdot |h_{i,i}(f)|^2 \cdot L_i \cdot f^2} \quad (15)$$

Here, $f \in \Theta$ is the set of frequencies where noise is measured and $\|\Theta\|$ denotes the size of the set (number of measured frequencies).

A further option that may yield higher accuracy is to use a common optimization technique such as linear least-squares optimization (as found in most linear algebra textbooks) by minimizing the mean squared difference between the noise measurement and the noise model. This minimization is performed over the set of frequencies $f \in \Phi$ where noise measurements are available. Such a least squares optimization problem can be employed for finding the coefficient vector x that minimizes the matrix norm of the difference between the measured noise vector (denoted b) and the modeled noise (matrix A times vector x), i.e. $\arg_x \min \|Ax - b\|$. Here the modeled noise can include more components: e.g. both the FEXT model and a model for the remaining part of the noise. Including a suitable model for the background noise can improve the accuracy of the FEXT coupling coefficient. One example of such a model is that $N_i(f)$ is assumed to be frequency independent and can be replaced by an unknown constant $N_0$. It is also possible to include a model for NEXT in order to improve FEXT estimation when non-negligible amounts of NEXT are present.

If the matrix A is a square matrix with full rank, the problem is trivially solved as a linear equation system. Minimization of the matrix norm of Ax−b when A has more rows than columns can be solved using the commonly available methods for solving over-determined equation systems, e.g.:

$$\underset{x}{\operatorname{argmin}} \left\| \underbrace{[(|h_{i,i}(f)|^2 \cdot L_i \cdot f^2 \cdot \overline{S}(f))^T 1^T]}_{A} \cdot \underbrace{\begin{bmatrix} \hat{k}_i \\ N_0 \end{bmatrix}}_{x} - \underbrace{[(R_{noise,i}(f))^T]}_{b} \right\| \Rightarrow \quad (16)$$

$$\Rightarrow \begin{bmatrix} \hat{k}_i \\ N_0 \end{bmatrix} = (A^T A)^{-1} A^T b$$

where T is the matrix transpose operator, "−1" means matrix inverse, and A is a two-column matrix with as many rows as the number of frequencies in the set $\Theta$. The first column of A consists of the FEXT model per frequency and the second column is a vector of ones ($1^T$).

In expression (16) above, background noise is modeled as constant over frequency (hence the column of ones). However, other models such as a first order polynomial of frequency and/or a model of NEXT may be used.

As shown above, the column vector b contains the measured noise per frequency in the set $\Theta$. The result of solving the above expression (16) is a vector with the sought FEXT coupling coefficient $\hat{k}_i$ and a coefficient $N_0$ describing the background noise level.

In many cases, it is expected that the averaging method in expression (15) can estimate the FEXT coupling coefficient with sufficient accuracy and thus it may not be necessary to use the more computationally complex optimization methods needed to solve (16).

From the definition of binder fill ratio given earlier, the estimate of the coupling coefficient can be used to get an estimate $\hat{q}_i$ of the binder fill ratio q under the assumption of a 1% worst-case scenario:

$$\hat{q}_i = \left( \frac{\hat{k}_i}{2.62 \cdot 10^{-19}} \right)^{\frac{1}{0.6}} \quad (17)$$

Figures 2A, 2B, 2C, 3:
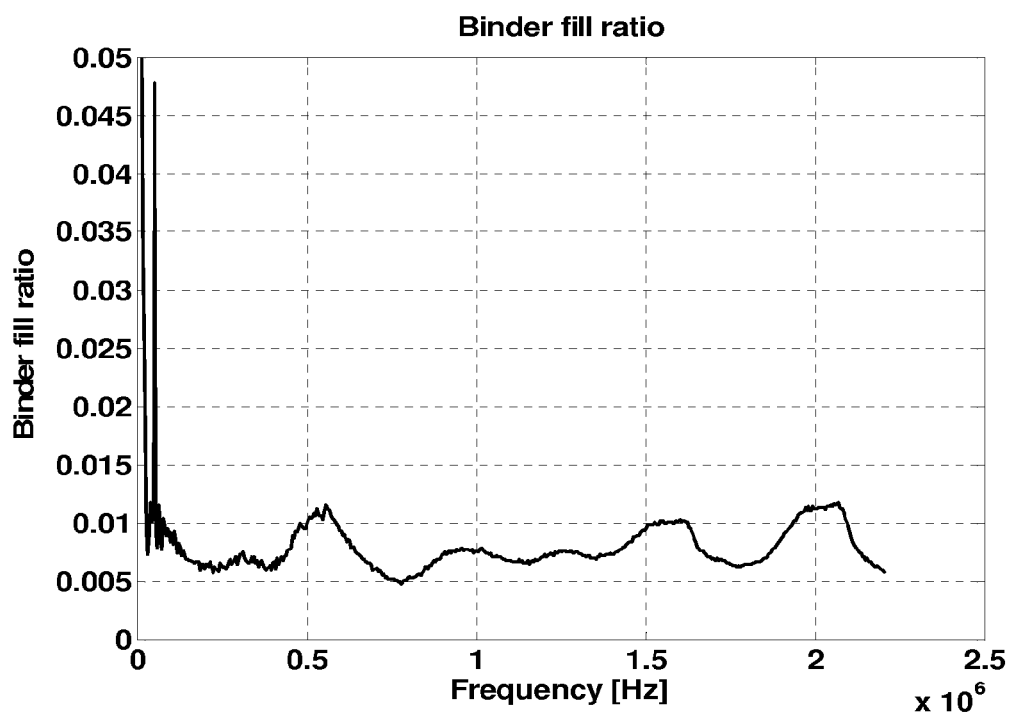
FIG. 3 is a diagram illustrating binder fill ratio calculated from an estimate of far-end crosstalk coupling.

From expression (17) follows that it may be said that a binder fill ratio for communication line no. i can be calculated based on a coupling coefficient, which is illustrated in FIG. 2a. It should be noted that expression (17) will in most cases not show the actual binder fill ratio but can be used to detect problems where the FEXT level is too high; if the estimated binder fill ratio is greater than a certain threshold $q_{max}$, a warning could be issued, stating that the line may have problems with crosstalk levels. For example, setting $q_{max}=1$ would trigger said warning if the upstream FEXT levels are higher than the 1% worst case levels in a full binder. Since it is a 1% worst case model and since binders are rarely completely fully used, this could be used to indicate a fault that degrades balance and/or symmetry of the pair.

Instead of using noise, it is possible to use another parameter that depends on the noise, e.g. the Signal-to-Noise Ratio (SNR). SNR per frequency is calculated as the received signal PSD divided by the total noise PSD:

$$SNR_i(f) = \frac{\hat{R}_{Signal,i}(f)}{\hat{R}_{Noise,i}(f)} = \frac{S_i(f)|h_{i,i}(f)|^2}{\hat{R}_{FEXT,i}(f) + N_i(f)} = \ldots \quad (18)$$

$$= \frac{S_i(f)|h_{i,i}(f)|^2}{\overline{S}(f)|h_{i,i}(f)|^2 \cdot \hat{k}_i \cdot L_i \cdot f^2 + N_i(f)} =$$

$$= \frac{1}{\frac{\overline{S}(f)}{S_i(f)} \cdot \hat{k}_i \cdot L_i \cdot f^2 + \frac{N_i(f)}{S_i(f)|h_{i,i}(f)|^2}}$$

Now, assuming that the transmit PSD $S_i(f)$ on line i is equal to the aggregate transmit PSD $\overline{S}(f)$, the above expression can be written as:

$$SNR_i(f) = \frac{1}{\hat{k}_i \cdot L_i \cdot f^2 + \frac{N_i(f)}{\overline{S}(f) \cdot |h_{i,i}(f)|^2}} \quad (19)$$

For frequencies where FEXT is the dominating noise component, it is often possible to simplify this further to:

$$SNR_i(f) = \frac{1}{\hat{k}_i \cdot L_i \cdot f^2} \quad (20)$$

i.e. the calculated SNR only depends on the FEXT coupling coefficient, the coupling length and the frequency. From expression (20) follows that it may be said that a signal to noise ratio for communication line no. i can be determined based on a maximal coupling coefficient $\hat{k}_{i,max}$, a crosstalk coupling length and the used frequency, which is illustrated by FIG. 2b. Solving expression (20) for the FEXT coupling coefficient gives $$\hat{k}_i = \frac{1}{SNR_i(f) \cdot L_i \cdot f^2} \quad (21)$$

From expression (21) follows that it may be said that a coupling coefficient for communication line no. i can be determined based on a measured signal to noise ratio, a crosstalk coupling length and the used frequency, which is illustrated by FIG. 2c. If SNR is measured at multiple frequencies, the coupling coefficient can for example be calculated as an average:

$$\hat{k}_i = \frac{1}{\|\Theta\|} \sum_{f \in \Theta} \frac{1}{SNR_i(f) \cdot L_i \cdot f^2} \quad (22)$$

where as before, $f \in \Theta$ is the set of frequencies where noise is measured and $\|\Theta\|$ denotes the size of the set (number of measured frequencies).

It would also be possible to use a least-squares optimization to determine the coupling coefficient, similar to the case when noise PSD was used instead of SNR.

The resulting binder fill ratio can be calculated from (17) as before.

Instead of determining the coupling coefficient or the binder fill ratio and comparing that with a threshold, a similar result can be achieved by calculating noise (or e.g. SNR) using a specific binder fill ratio (e.g. 1) and comparing the measured noise with the calculated noise (or e.g. SNR).

With the knowledge of $\hat{k}_i$, it is now possible to apply the FEXT model from expression (11) and combine this with expression (7) in order to get an estimate of the FEXT level:

$$\hat{R}_{FEXT,i}(f) = \overline{S}(f) \cdot |h_{i,i}(f)|^2 \cdot \hat{k}_i \cdot L_i \cdot f^2. \quad (23)$$

For FEXT-dominated lines, the FEXT estimated above can be used directly as the total noise level. However, it may be too low in certain cases unless also the background noise level is taken into account. The total noise (excluding any NEXT) would then be the sum of FEXT and background noise where the background noise is e.g. a priori known (or based on an assumption):

$$\hat{R}_{Noise,i}(f) = \hat{R}_{FEXT,i}(f) + \hat{N}_i(f) \quad (24)$$

A common assumption for DSL is that the background noise of a CPE is −140 dBm/Hz although this may vary in practice. DSLAMs usually have slightly higher background noise levels, e.g. −130 dBm/Hz. Using expression (19) would guarantee that estimated far-end noise levels will not go below the assumed background noise level $\hat{N}_i(f)$. A similar effect, although less correct, could be reached by taking the maximum of the dB values of the estimated FEXT and background noise levels.

Now, the calculated noise level can be compared with the measured noise level and if the measured level exceeds the calculated level by a certain margin, a fault is indicated.

A step-by-step example of one embodiment for detecting a fault, using a noise or e.g. an SNR measurement, can be summarized as:
 On the selected line and direction (up-/downstream), measure the SNR (or e.g. the received noise) for at least one receive band frequency.
 If the received noise was measured, estimate the direct channel power transfer function (phase is not needed) for all frequencies of interest and the crosstalk coupling length $L_i$ from e.g. SELT.

Estimate the FEXT coupling coefficient $\hat{k}_i$ from the noise, using e.g. expression (22) if SNR is known. If the noise and power transfer function are known use e.g. expression (15) together with knowledge about the average transmit PSDs (e.g. assuming max allowed PSD).
 Calculate the binder fill ratio estimate $\hat{q}_i$ from $\hat{k}_i$ using expression (17). Then compare with a threshold $q_{max}$ to see whether the binder fill ratio is within reasonable limits. If not, issue a warning.

A step-by-step example of another embodiment for detecting a fault, using a noise measurement, can be summarized as:
 On the selected line and direction (up-/downstream), measure received noise (or e.g. SNR) in the DSL transceiver for at least one receive band frequency.
 Estimate the direct channel power transfer function. (phase is not needed) for all frequencies of interest and the crosstalk coupling length $L_i$ e.g. from SELT
 Calculate the coupling coefficient threshold $\hat{k}_{i,max}$ corresponding to a configured binder fill ratio threshold $q_{max}$ using (17).
 Calculate worst-case noise (or e.g. SNR) per frequency using (23) or (24), with $\hat{k}_{i,max}$ instead of $\hat{k}_i$. If the input parameter is SNR, use (20) or (19) instead of (23) or (24).
 Count the number of frequencies $N_f$ where the measured noise exceeds the calculated noise from the model (for SNR, $N_f$ would be the number of frequencies where the measured SNR is below the calculated SNR). If $N_f$ exceeds a threshold $N_{f,max}$, a fault is indicated.
 Optionally, calculate the ratio between the measured and calculated noise levels (or SNR levels) per frequency (difference in dB scale) and then calculate the variance of the dB values of this ratio. If this variance is larger than a threshold $V_{max}$, a fault may be indicated even if $N_f$ is smaller than the threshold $N_{f,max}$.

With suitable modifications the embodiment above can be applied for other parameters such as SNR.

To verify the accuracy of the model and justifying the introduction of the binder fill ratio q, a series of measurements were performed on a 500 m 10-pair cable with a gauge of 0.4 mm. Using the measured noise, it is possible to calculate the estimated coupling constant $\hat{k}_1$ in expression (15) and then also the estimated binder fill ratio $\hat{q}_1$. If the model in expression (11) would be a perfect representation of the real FEXT crosstalk, the estimated binder fill ratio should be constant with frequency.

With reference to FIG. 3, which illustrates binder fill ratio calculated from an estimate of FEXT coupling, there are some variations in the estimated binder fill ratio but except for the disturbance at low frequencies it is fairly constant and thus the model gives a good approximation of the frequency behavior of the noise. FIG. 3 also shows, as expected, that the estimated value of the binder fill ratio is much lower than the actual binder fill ratio (=1.0) since the model represents the 1% worst case crosstalk while the measured cable has lower FEXT. This indicates that there are likely no severe metallic faults on the line.

To assess the usefulness of the described apparatus and method a series of measurements were performed in a lab environment utilizing common DSL equipment. A DSL Access Multiplexer (DSLAM) was connected to all the pairs in a 10-pair cable of length 500 meter and gauge 0.4 mm. The other ends of the pairs were connected to 10 VDSL2 compatible Customer Premises Equipments (CPEs) emulating a small network with 10 users. The equipment was configured to use the B8-11 bandplan of the VDSL2 standard (G.993.2) meaning transmission up to 17 664 kHz. The frequencies of the upstream and downstream bands as given in the standard are shown in the table below (Bandplan B8-11 from ITU-T G.993.2), where the frequency values indicate the frequencies of the band boundaries.

| Band | US0 | DS1 | US1 | DS2 | US2 | DS3 |
|---|---|---|---|---|---|---|
| Frequency [kHz] | N/A | 138 | 3750 | 5200 | 8500 | 12000 | 17664 |

The first pair in the cable was chosen as the test pair and DELT measurements (known as Loop Diagnostics in G.993.2) were performed to retrieve the data needed for the described algorithms. The first measurement was a reference measurement, i.e. the line was in a normal condition with no metallic faults present on the line. The balance of the cable should hence be quite good and the crosstalk seen by the test pair from the other nine pairs should be on a typical level.

Figure 4:
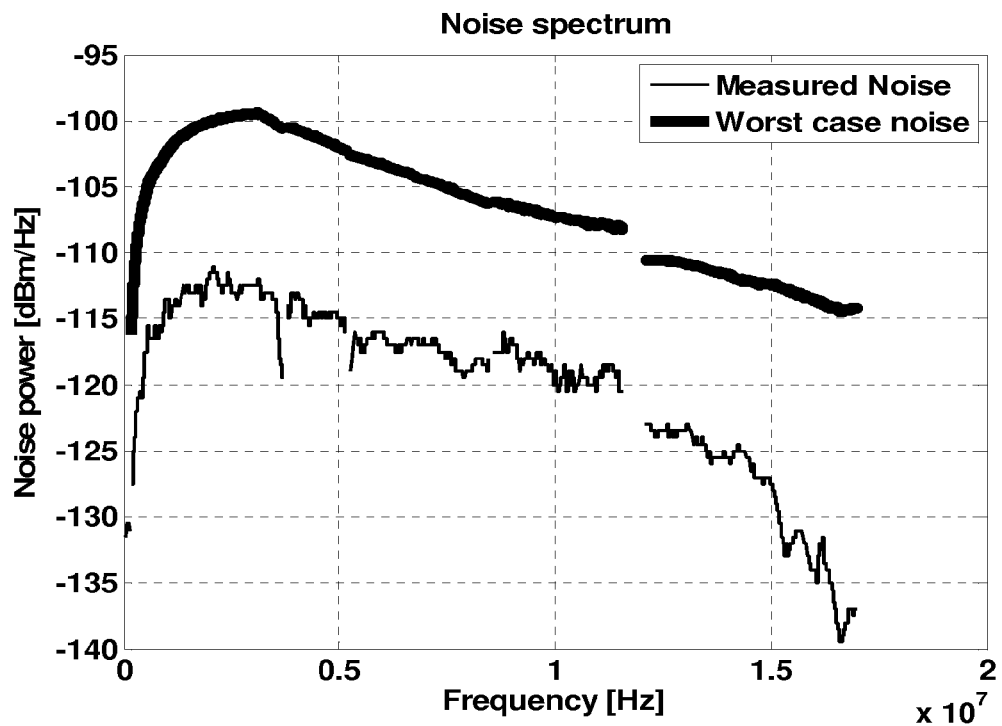
FIG. 4 is a diagram illustrating measured and calculated (worst-case) noise for a reference case.

With reference to FIG. 4, measured and calculated (worst-case) noise for the reference case is illustrated, and shows the result from the Quiet Line Noise (QLN) measurement together with the estimated worst-case FEXT. The thin line shows the measured noise while the bold line shows the worst-case FEXT calculated from (23) using $q_{max}=1$. As can be seen the measured noise is more than 10 dB below the worst case noise and it can hence be assumed that the line balance is fairly good.

Figure 5:
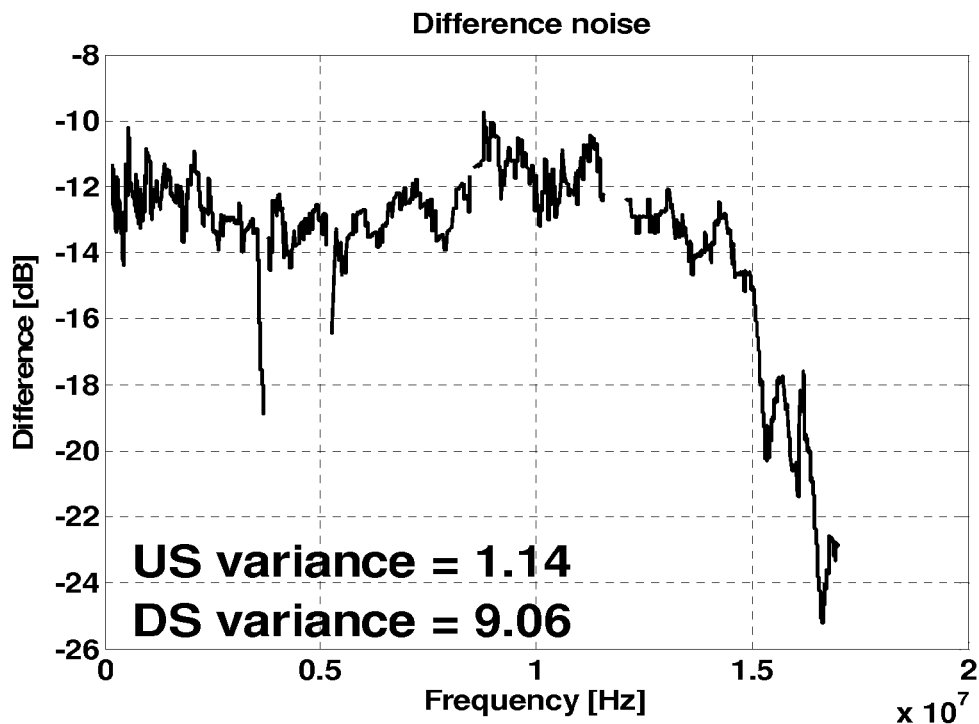
FIG. 5 is a diagram illustrating a difference in dB between measured and calculated (worst-case) noise for the reference case.

Another way of visualizing this is to calculate the difference between the measured noise and the worst case noise, which is illustrated by FIG. 5 that shows ddifference in dB between measured and calculated (worst-case) noise. If the measured noise would be as bad as, or worse than the worst case noise, this difference will become positive and a warning could be issued that an unexpectedly high noise was measured. Another indication that the line is affected by some type of fault is that the noise and/or power transfer function will vary a lot over frequency. Therefore the variance of the difference can be calculated and thresholds can be set to issue a warning based on this as well.

Figure 6:
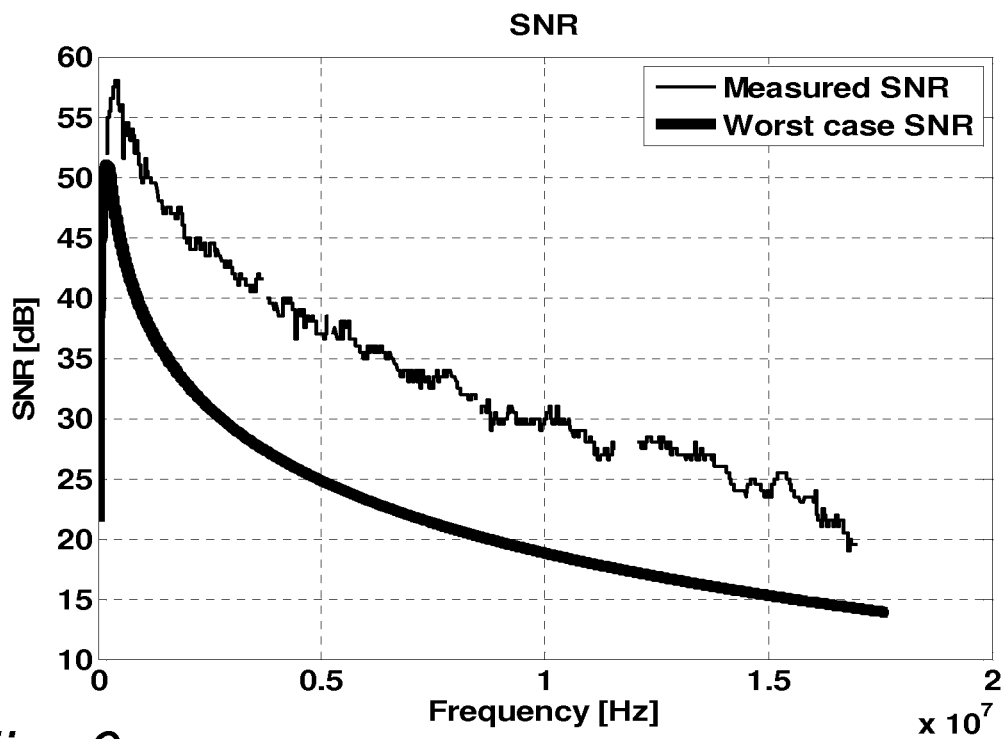
FIG. 6 is a diagram illustrating measured and calculated SNR for the reference case.
Figure 7:
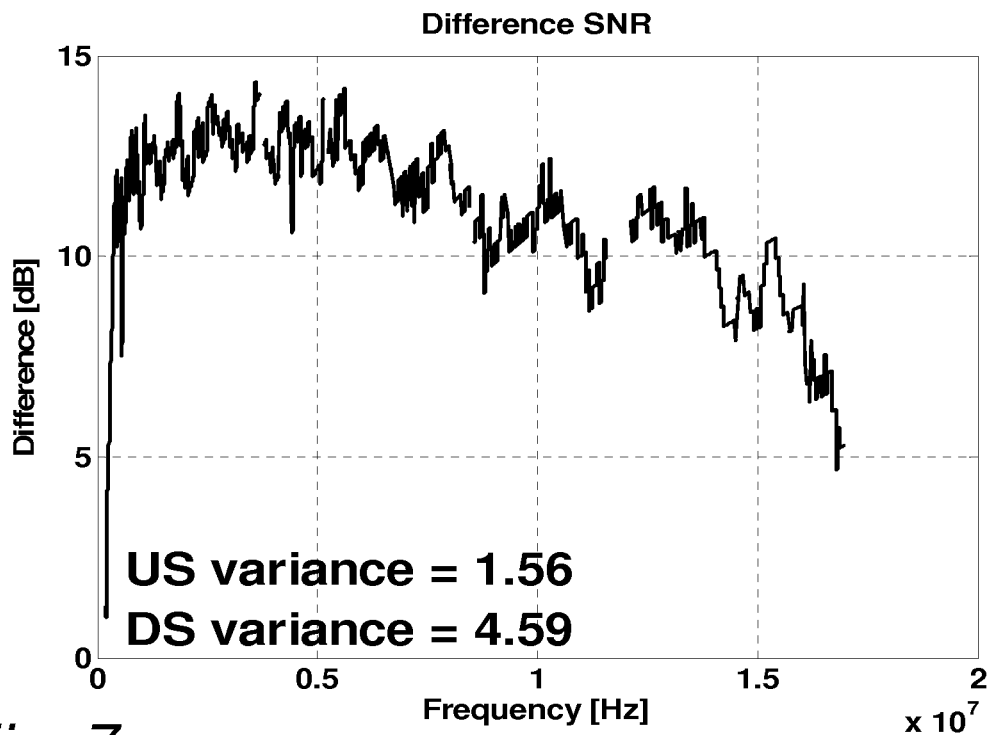
FIG. 7 is a diagram illustrating a difference between measured and calculated SNR for the reference case.

FIG. 6, which illustrates measured and calculated SNR for the reference case, and FIG. 7, which illustrates difference between measured and calculated SNR for the reference case, show the results for when the algorithms are based on SNR instead of the noise measurement. The FIGS. 6 and 7 show similar results as for the noise test indicating that both methods are equally good to detect degraded line balance.

Figure 12:
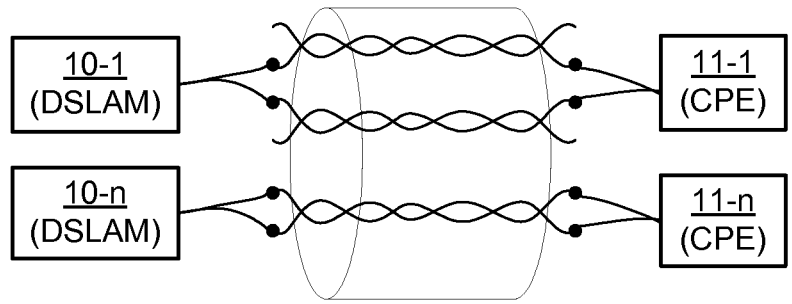
FIG. 12 is a diagram illustrating a split-pair coupling between a DSLAM and CPE and a correct coupling between a DSLAM and CPE.

In order to compare the previous results with a scenario where the line had reduced balance, a common metallic fault called "split pair" was inflicted to the line. A split pair is caused by misplaced connections at two points on the line so that two wires from different twisted pairs are used for transmission. This will reduce the symmetry of the two wires in the pair causing a severe impact on the balance. A schematic of the fault is shown in FIG. 12, where a first DSLAM 10-1 has a split pair connection to a first CPE 11-1, and where a further DSLAM 10-$n$ is properly connected to a further CPE 11-$n$.

Figure 8:
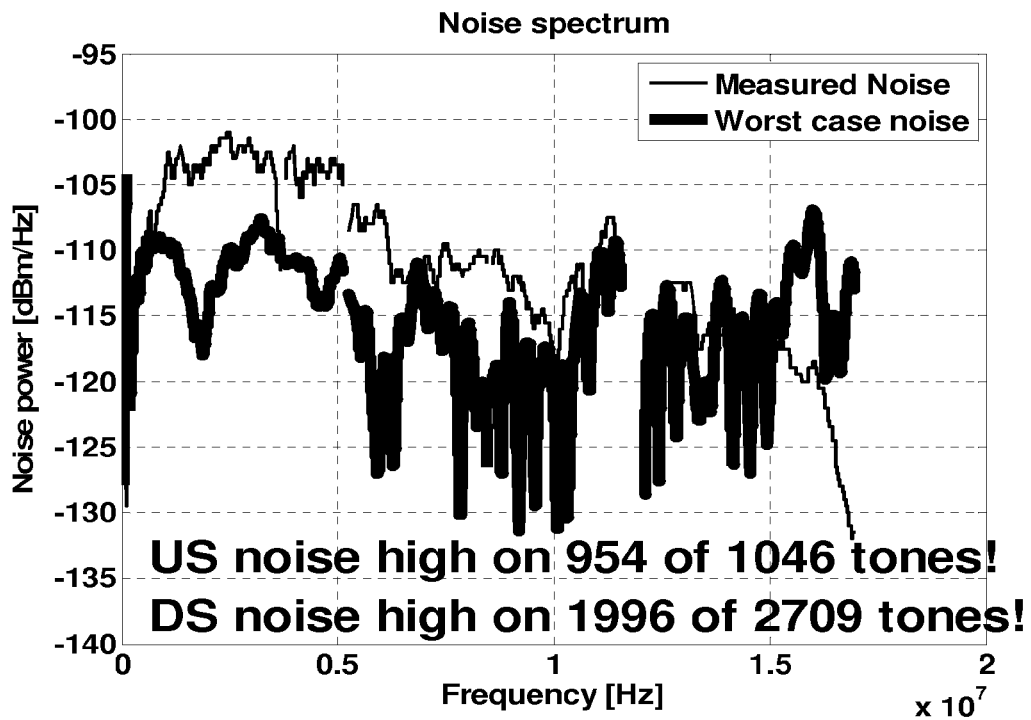
FIG. 8 is a diagram illustrating measured and calculated (using worst-case far-end crosstalk model) noise PSD for a split-pair case.
Figure 9:
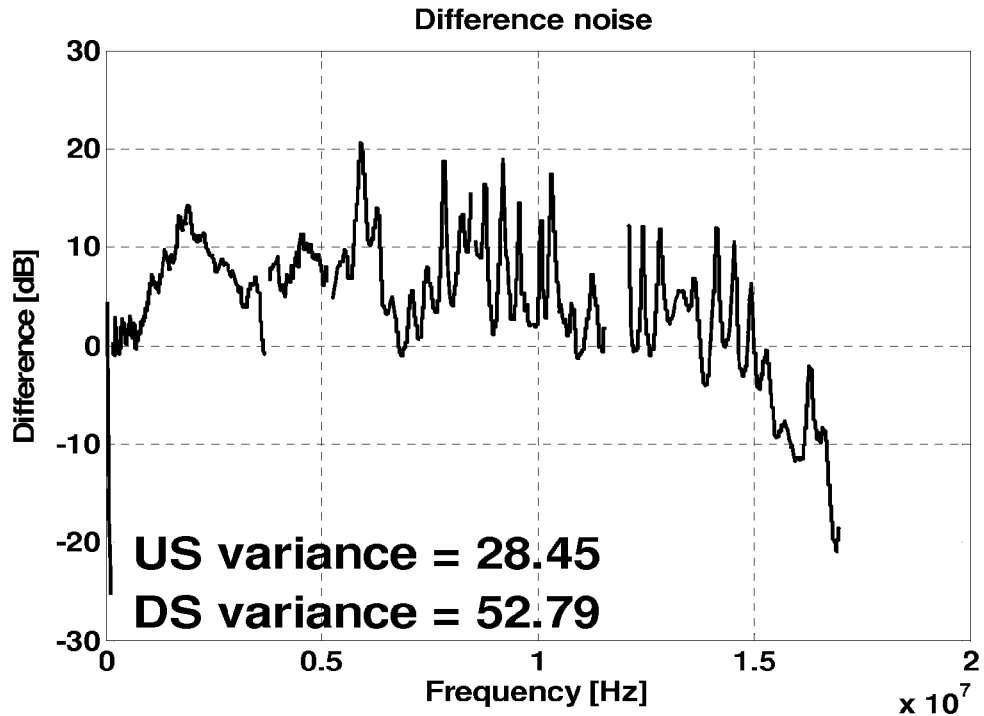
FIG. 9 is a diagram illustrating a difference between measured and calculated (using worst-case far-end crosstalk model) noise PSD for the split-pair case.

For the split-pair case, FIG. 8 shows the measured noise and the calculated noise while FIG. 9 shows the difference between the measured noise and the calculated noise. The measured noise is higher than the worst case noise for a major part of the spectrum and it can also be seen that the variance of the noise difference is much higher than for the first measurement scenario. It can thus be concluded that the proposed method works well for detecting that faults such as a split pair is present on the line. The reason for the large variance of the calculated worst case noise is because the fault affects the power transfer function. The method will thus not only depend on the noise power but it will also detect irregularities in the power transfer function.

Figure 10:
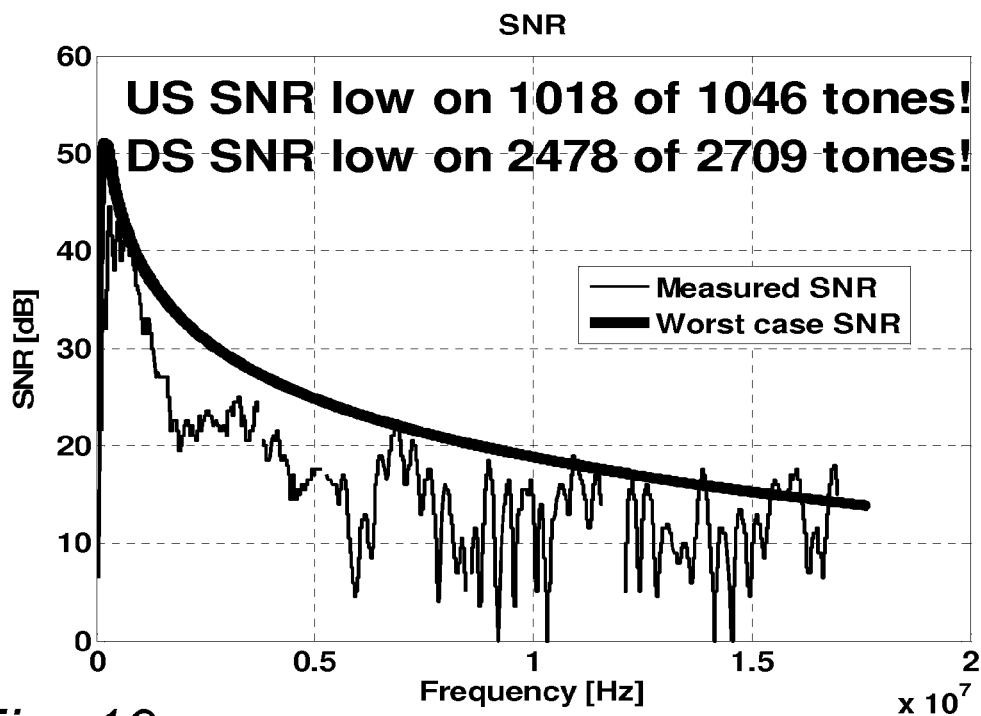
FIG. 10 is a diagram illustrating measured SNR and calculated SNR based on the worst-case model for the split-pair case.
Figure 11:
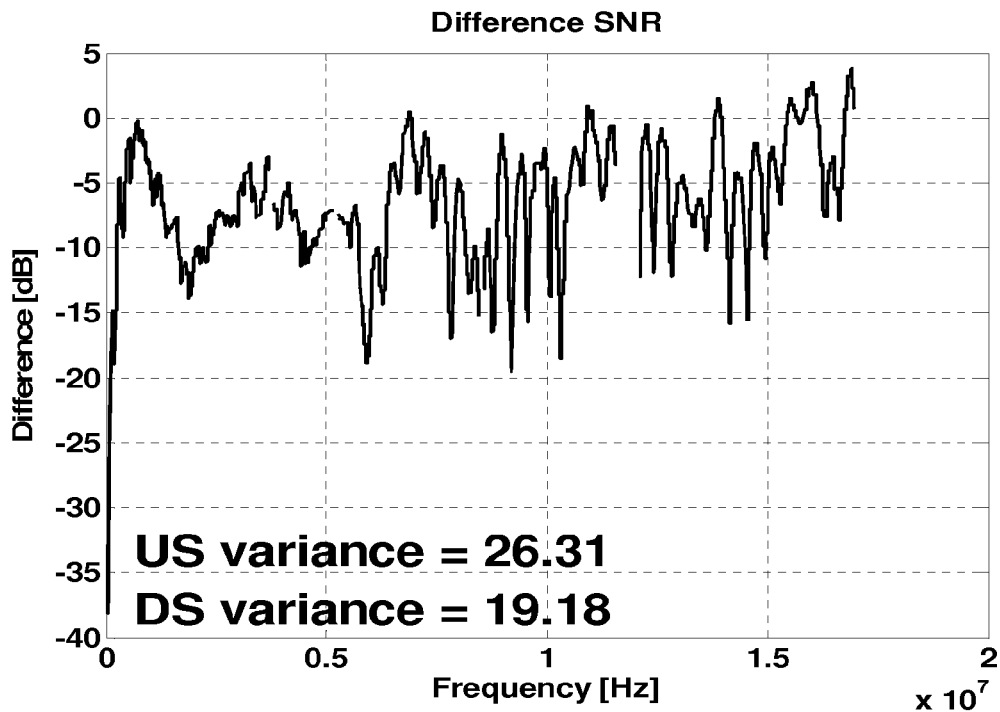
FIG. 11 illustrates a difference between measured SNR and calculated SNR based on the worst-case model for the split-pair case.

For the split-pair case, FIGS. 10 and 11 show the corresponding graphs for the SNR, where FIG. 10 illustrates measured SNR and calculated SNR based on the worst-case model, and FIG. 11 illustrates the between measured SNR and calculated SNR based on the worst-case model. The calculation of worst case SNR is not based on power transfer function and thus the curve will be smooth. The fluctuations will instead be visible in the measured SNR values since SNR depends both on noise and transfer function. As for the noise case it is possible to detect degraded line balance both from the variance and from the fact that the measured SNR is lower than the worst case SNR.

Figure 13:
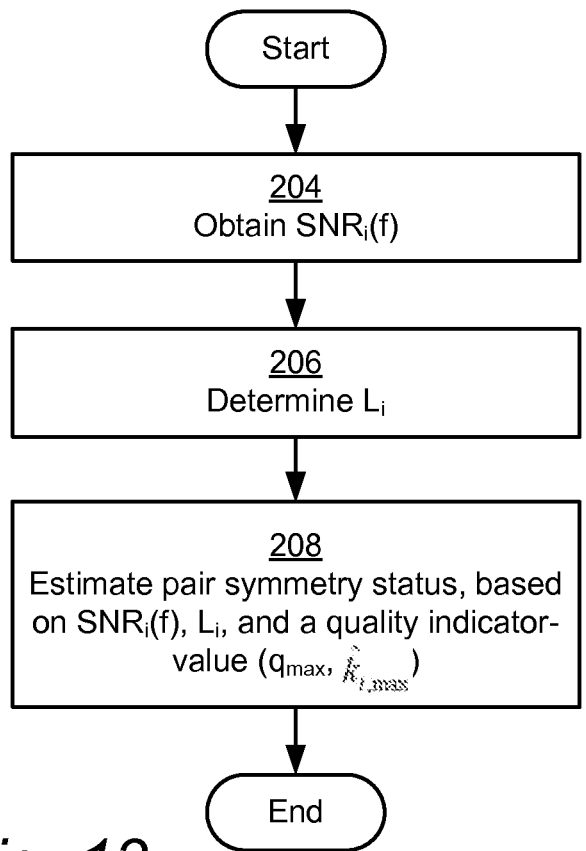
FIG. 13 is a flow diagram illustrating an embodiment of a method for estimating pair symmetry status.

The most general form of the method for estimating pair symmetry status for the communication line $C_i$ is illustrated by FIG. 13, which shows a first step 204 of obtaining a value set indicative of a signal to noise ratio $SNR_i(f)$ for the communication line $C_i$ and at a receive band frequency f. Next 206 a crosstalk coupling length $L_i$ for the communication line $C_i$ is determined. Finally 208 the pair symmetry status is estimated, based on the obtained value set indicative of the signal to noise ratio $SNR_i(f)$, the crosstalk coupling length $L_i$ and a predetermined symmetry indicator-value $q_{max}$ or $\hat{k}_{i,max}$.

Figure 14:
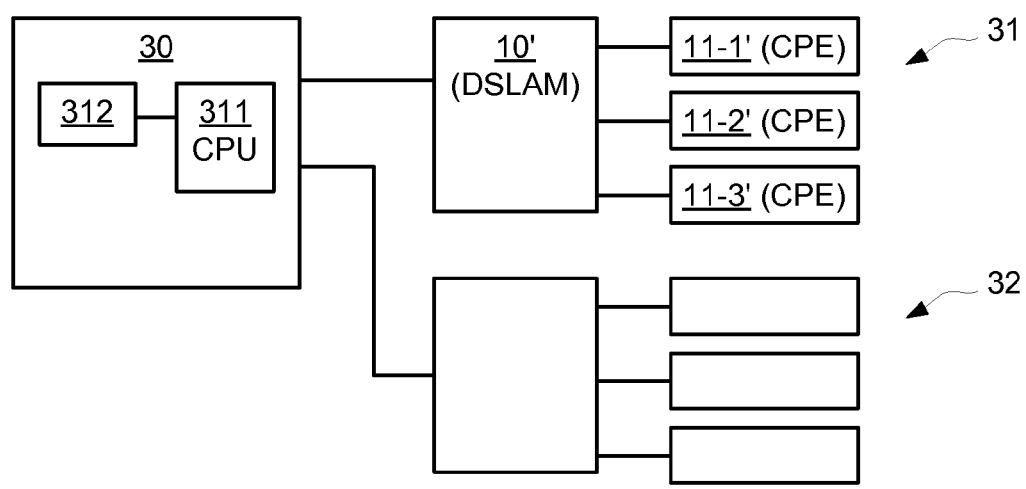
FIG. 14 illustrates an embodiment of an operations and management apparatus capable of estimating pair symmetry status for a communication line.

Moreover, with reference to FIG. 14, the invention may be implemented as an apparatus 30 which can manage sets of DSLAM units and CPEs, such as set 31 and set 32. The sets can be similar and can each comprise a standard DSLAM unit 10' to which a number of conventional CPEs 11-1', 11-2', 11-3' are connected.

The apparatus 30 can be implemented as an O&M (operations and management) system which typically has the form of a workstation or similar computer. Thus, the apparatus may comprise a O&M system for DSLAM units and CPEs. The apparatus 30 has a processing unit 311 and a memory unit 312 which stores processing instructions that, when executed by the processor unit 311, performs the above described method of estimating pair symmetry status for a communication line.

In this case the method performed by the apparatus 30 corresponds to the method described above, with the difference that measurements are received by the apparatus 30 after the relevant DSLAM has performed the measurement.

Software instructions, i.e. a computer program code for carrying out embodiments of the described method may for development convenience be written in a high-level programming language such as Java, C, and/or C++ but also in other programming languages, such as, but not limited to, interpreted languages. The software instructions can also be written in assembly language or even micro-code to enhance performance and/or memory usage. It will be further appreciated that the functionality of any or all of the functional steps performed by the apparatus may also be implemented using discrete hardware components, one or more application specific integrated circuits, or a programmed digital signal processor or microcontroller. Accordingly, e.g. the computer-readable medium of the DSLAM unit and a corresponding memory units in the CPE 11-1 and the apparatus in form of a O&M system can store processing (software) instructions that, when executed by e.g. the respective processor unit, performs the described method.

Also, operations of the apparatus may be performed in a different order than described, may be combined and may be divided into sub-operations. Furthermore, additional operations may be performed by the processor unit and certain operations can be performed only when a certain accuracy is needed.

In practice, the invention may be implemented in e.g. already existing DSLAM units and CPE units, as well as in an apparatus in form of an O&M (operations and management) system, without requiring any introduction of new hardware components, as long as the relevant processing unit of the DSLAM/CPE/O&M apparatus (system) is configured to perform the described method.

Although various embodiments of the invention have been described and shown, the invention is not restricted thereto, but may also be embodied in other ways within the scope of the subject-matter defined by the above described apparatuses and method.

The invention claimed is:

1. An apparatus for estimating pair symmetry status for a communication line ($C_i$), the apparatus configured to:
   obtain a value set indicative of a signal to noise ratio ($SNR_i(f)$) for the communication line ($C_i$) and at a receive band frequency (f),
   determine a crosstalk coupling length ($L_i$) for the communication line ($C_i$), and
   estimate the pair symmetry status, based on the obtained value set indicative of the signal to noise ratio ($SNR_i(f)$), the crosstalk coupling length ($L_i$) and a predetermined symmetry indicator-value ($q_{max}$; $\hat{k}_{i,max}$).

2. The apparatus according to claim 1, wherein the apparatus is further configured to estimate the pair symmetry status by:
   determining a coupling coefficient ($\hat{k}_i$) based on the obtained value set indicative of the signal to noise ratio ($SNR_i(f)$) and based on the crosstalk coupling length ($L_i$), and
   comparing a value indicative of the determined coupling coefficient ($\hat{k}_i$) with the predetermined quality indicator-value ($\hat{k}_{i,max}$).

3. The apparatus according to claim 2, wherein the apparatus is further configured to determine the coupling coefficient ($\hat{k}_i$) based on $$\hat{k}_i = \frac{1}{SNR_i(f) \cdot L_i \cdot f^2}.$$

4. The apparatus according to claim 2, wherein the apparatus is further configured to:
   determine a binder fill ratio ($\hat{q}_i$) as a function of the coupling coefficient ($\hat{k}_i$), and
   estimate the pair symmetry status by comparing the binder fill ratio ($\hat{q}_i$) with the predetermined symmetry indicator-value ($q_{max}$).

5. The apparatus according to claim 1, wherein the apparatus is configured to estimate the pair symmetry status by:
   calculating a value set indicative of a signal to noise ratio ($\hat{SNR}_i(f)$), based on the crosstalk coupling length ($L_i$) and the predetermined symmetry indicator-value ($q_{max}$; $\hat{k}_{i,max}$), and
   comparing the obtained value set indicative of the signal to noise ratio ($SNR_i(f)$) with the calculated value set indicative of the signal to noise ratio ($\hat{SNR}_i(f)$).

6. The apparatus according to claim 5, wherein the apparatus is further configured to calculate the signal to noise ratio ($\hat{SNR}_i(f)$) based on $$\hat{SNR}_i(f) = \frac{1}{\hat{k}_{i,max} \cdot L_i \cdot f^2}.$$

7. The apparatus according to claim 1, wherein the obtained value set indicative of the signal to noise ratio ($SNR_i(f)$) is retrieved by execution of a single or double-ended line test for the communication line ($C_i$).

8. The apparatus according to claim 1, wherein at least a part of the obtained value set indicative of the signal to noise ratio ($SNR_i(f)$) is retrieved by execution of a quiet line noise measurement in the communication line ($C_i$).

9. The apparatus according to claim 1, wherein the apparatus is configured to estimate the pair symmetry status by taking into account a background noise ($N_i(f)$) in the communication line ($C_i$).

10. The apparatus according to claim 1, wherein the apparatus is configured for being able to estimate the pair symmetry status when an end ($C_i$-2) of the communication line ($C_i$) is not connected to any customer premises equipment (CPE) that is used for estimating the pair symmetry status.

11. A method for estimating pair symmetry status for a communication line ($C_i$), the method comprising:
   obtaining a value set indicative of a signal to noise ratio ($SNR_i(f)$) for the communication line ($C_i$) and at a receive band frequency (f),
   determining a crosstalk coupling length ($L_i$) for the communication line ($C_i$), and
   estimating the pair symmetry status, based on the obtained value set indicative of the signal to noise ratio ($SNR_i(f)$), the crosstalk coupling length ($L_i$) and a predetermined symmetry indicator-value ($q_{max}$; $\hat{k}_{i,max}$).

12. The method according to claim 11, wherein the pair symmetry status is estimated by:
   determining a coupling coefficient ($\hat{k}_i$) based on the value set indicative of the obtained signal to noise ratio ($SNR_i(f)$) and based on the crosstalk coupling length ($L_i$), and
   comparing a value indicative of the determined coupling coefficient ($\hat{k}_i$) with the predetermined quality indicator-value ($\hat{k}_{i,max}$).

13. The method according to claim 12, wherein the coupling coefficient ($\hat{k}_i$) is determined based on $$\hat{k}_i = \frac{1}{SNR_i(f) \cdot L_i \cdot f^2}.$$

14. The method according to claim 12, further comprising:
   determining a binder fill ratio ($\hat{q}_i$) as a function of the coupling coefficient ($\hat{k}_i$), and
   estimating the pair symmetry status by comparing the binder fill ratio ($\hat{q}_i$) with the predetermined symmetry indicator-value ($q_{max}$).

15. The method according to claim 11, wherein the pair symmetry status is estimated by:
   calculating a value set indicative of a signal to noise ratio ($\hat{SNR}_i(f)$), based on the crosstalk coupling length ($L_i$)) and the predetermined symmetry indicator-value ($q_{max}$; $\hat{k}_{i,max}$), and
   comparing the obtained value set indicative of the signal to noise ratio ($SNR_i(f)$) with the calculated value set indicative of the signal to noise ratio ($\hat{SNR}_i(f)$).

16. The method according to claim 15, wherein the signal to noise ratio ($\hat{S}NR_i(f)$) is calculated based on $$\hat{S}NR_i(f) = \frac{1}{\hat{k}_{i,max} \cdot L_i \cdot f^2}.$$

17. The method according to claim 11, wherein the obtained value set indicative of the signal to noise ratio ($SNR_i(f)$) is retrieved by execution of a single or double-ended line test for the communication line ($C_i$).

18. The method according to claim 11, wherein at least a part of the obtained value set indicative of the signal to noise ratio ($SNR_i(f)$) is retrieved by execution of a quiet line noise measurement in the communication line ($C_i$).

19. The method according to claim 12, further comprising estimating the pair symmetry status by taking into account a background noise ($N_i(f)$) in the communication line ($C_i$).

20. The method according to claim 11, wherein an end ($C_i$-2) of the communication line ($C_i$) is not connected to any customer premises equipment (CPE) that is used for estimating the pair symmetry status.

21. A computer program product stored in a non-transitory computer-readable medium for controlling a processor unit, the computer program product comprising software instructions which, when run, causes the processor unit to:
obtain a value set indicative of a signal to noise ratio ($SNR_i(f)$) for the communication line ($C_i$) and at a receive band frequency (f),
determine a crosstalk coupling length ($L_i$) for the communication line ($C_i$), and
estimate the pair symmetry status, based on the obtained value set indicative of the signal to noise ratio ($SNR_i(f)$), the crosstalk coupling length ($L_i$) and a predetermined symmetry indicator-value ($q_{max}$; $\hat{k}_{i,max}$).

* * * * *

UNITED STATES PATENT AND TRADEMARK OFFICE
CERTIFICATE OF CORRECTION

PATENT NO. : 8,537,973 B2
APPLICATION NO. : 13/635838
DATED : September 17, 2013
INVENTOR(S) : Berg et al.

It is certified that error appears in the above-identified patent and that said Letters Patent is hereby corrected as shown below:

In the Specification

In Column 7, Line 15, delete "10-n.Each" and insert -- 10-n. Each --, therefor.

In Column 8, Line 44, delete "G.996.1.If" and insert -- G.996.1. If --, therefor.

In Column 9, Lines 23-24, in Expression (2), delete

" $\dfrac{(SNR_{dB} - SNRmargin_{dB} - SNRgap_{dB})}{10 \cdot \log_2(2)} =$ " and insert -- $\dfrac{(SNR_{dB} - SNRmargin_{dB} - SNRgap_{dB})}{10 \cdot \log_{10}(2)} =$ --, therefor.

In Column 11, Line 42, delete "2001.Using" and insert -- 2001. Using --, therefor.

In Column 11, Line 46, in Expression (11), delete " $|H_i(f)|^2 = |h_{i,j}(f)|^2 \cdot k_i \cdot L_i \cdot f^2$ " and insert -- $|H_i(f)|^2 = |h_{i,j}(f)|^2 \cdot k_i \cdot L_i \cdot f^2$ --, therefor.

In Column 11, Line 56, delete "insignificant" and insert -- insignificant. --, therefor.

In Column 13, Line 20, delete " $\arg_x \min \|Ax - b\|$ " and insert -- $\arg \min_x \|Ax - b\|$ --, therefor.

In Column 14, Line 10, delete "2a.It" and insert -- 2a. It --, therefor.

Signed and Sealed this
Eighteenth Day of February, 2014

Michelle K. Lee
*Deputy Director of the United States Patent and Trademark Office*

CERTIFICATE OF CORRECTION (continued)
U.S. Pat. No. 8,537,973 B2

In Column 14, Line 66, delete "2b.Solving" and insert -- 2b. Solving --, therefor.

In Column 15, Line 10, delete "2c.If" and insert -- 2c. If --, therefor.

In Column 16, Line 15, delete "function. (phase" and insert -- function (phase --, therefor.

In Column 16, Line 17, delete "SELT" and insert -- SELT. --, therefor.

In Column 17, Line 25, delete "$q_{max}$=1.As" and insert -- $q_{max}$=1. As --, therefor.

In Column 17, Line 31, delete "ddifference" and insert -- difference --, therefor.

In the Claims

In Column 20, Line 62, in Claim 15, delete "($L_i$))" and insert -- ($L_i$) --, therefor.